United States Patent [19]

Nagarajan et al.

[11] 4,397,079

[45] Aug. 9, 1983

[54] PROCESS FOR IMPROVING THE YIELD OF INTEGRATED DEVICES INCLUDING SCHOTTKY BARRIER DIODES

[75] Inventors: Arunachala Nagarajan, Wappingers Falls; Homi G. Sarkary, Hopewell Junction, both of N.Y.

[73] Assignee: International Business Machines Corp., Armonk, N.Y.

[21] Appl. No.: 249,260

[22] Filed: Mar. 30, 1981

[51] Int. Cl.[3] ............................................. C23C 15/00
[52] U.S. Cl. .................................... 29/576 B; 29/574; 148/1.5; 148/187; 156/643; 204/192 S; 204/192 R; 357/15
[58] Field of Search ............. 29/576 B, 574; 156/655, 156/653, 643; 204/192 S, 192 EC, 192 R; 148/1.5, 187; 357/15

[56] References Cited

U.S. PATENT DOCUMENTS

| | | | |
|---|---|---|---|
| 3,574,014 | 4/1971 | Hugle | 156/643 |
| 4,028,155 | 6/1977 | Jacob | 156/643 |
| 4,040,891 | 8/1977 | Chang et al. | 156/651 |
| 4,056,642 | 11/1977 | Saxena et al. | 427/84 |
| 4,110,125 | 8/1978 | Beyer | 148/1.5 |
| 4,134,817 | 1/1979 | Bourdon | 204/192 E |
| 4,135,998 | 1/1979 | Gniewek et al. | 204/192 E |

OTHER PUBLICATIONS

Chapman et al., IBM-TDB, 21, (1978), 797.
Beyer, IBM-TDB, 21, (1978), 1959.
Desilets et al., IBM-TDB, 22, (1979), 112.
Horieke et al., Japan Jr. Appl. Phys., 20, (Apr. 1981), 803.

*Primary Examiner*—Upendra Roy
*Attorney, Agent, or Firm*—John A. Jordan; John F. Ohlandt

[57] ABSTRACT

In the fabrication of Schottky barrier diodes, in conjunction with active devices such as transistors, it has become the conventional practice to use reactive ion etching (RIE) to remove a protective layer of $Si_3N_4$. This step of etching is used in forming the anode regions of the Schottky barrier diodes, as well as the active device regions of the transistors. It has been discovered by the present inventors that "resistive shorts" which have been produced in this context—thus ruining the Schottky barrier function—result from the fact that pinholes in the underlying oxide insulating layer permit the reactant gas to etch all the way down to the silicon substrate so as to produce diffusion paths or "pipes" through the oxide. Accordingly, instead of the oxide layer acting to block diffusion in the Schottky anode areas, these diffusion paths permit the resistive shorts to be formed. The present invention involves the use of a low energy collimated ion beam in an inert atmosphere, e.g. argon gas, to selectively remove the protective layer. In so doing the ion beam removes the $Si_3N_4$ without attacking any of the pinholes in the underlying oxide at the anode areas.

7 Claims, 2 Drawing Figures

PROCESS FOR IMPROVING THE YIELD OF INTEGRATED DEVICES INCLUDING SCHOTTKY BARRIER DIODES

BACKGROUND OF THE INVENTION

1. Field of the Invention

This invention relates to semiconductor integrated circuit manufacture, and more particularly to a method or process for fabricating Schottky barrier diode arrays, in conjunction with other semiconductor devices, to define integrated circuit arrays.

2. Background Information

In order to provide background material for a full appreciation of the present invention, reference may be made to the following: U.S. Pat. Nos. 3,539,876, 3,860,783, 4,047,975 and 4,135,998.

U.S. Pat. No. 3,539,876 generally discloses the complete technique or process for fabricating complicated monolithic integrated circuit structures. The details of relevant process steps are incorporated by reference.

U.S. Pat. No. 3,860,783 generally discloses the concept of ion etching through a pattern mask into a substrate surface.

U.S. Pat. No. 4,135,998 discloses a method for forming a Schottky barrier contact of platinum silicide, and is pertinent to the present invention in that it deals with the formation of such a diode in a silicon semiconductor substrate.

U.S. Pat. No. 4,047,975 discloses a method of making a bipolar integrated circuit involving the required doping of a substrate by means of a series of etching steps alternated with ionic implantation steps of a selected impurity type, as well as heat treatment steps. It is pertinent to the present invention only because it discloses the use of a vertical ion beam in an etching step.

The present invention has arisen in the context of the fabrication of the aforenoted Schottky barrier diodes in conjunction or association with other devices, such as transistors, so as to form integrated arrays.

In the attempt to improve the yield of highly dense arrays, comprising Schottky barrier diodes in association with transistors and the like, it has been discovered that "resistive shorts" occur in the SBD parts of the arrays. Consequently, the particular Schottky diodes having these resistive shorts are totally useless and hence the yield for the process is substantially reduced. This particular problem of resistive shorts is predominantly seen when the technique of reactive ion etching (RIE) has been employed at the point in the fabrication process when metallization contacts are about to be applied. That is to say, at the so called "all contacts" level in the conventional technology.

What has been found by the present invention is that any pinholes in the underlying silicon oxide layer—that is, the layer underlying the conventional silicon nitride protective layer—enables the reactive gas, typically CF$_4$, to etch all the way through the pinholes and down to the silicon substrate. As a result, when a subsequent diffusion step, such as a typical N+ diffusion in the case of a P-type substrate or P-type base region, is performed, the diffusion takes place through the "pipes" or diffusion paths thus created, thereby causing the observed resistive shorts.

In the effort to solve the problem of resistive shorts due to the pinholes being etched through, it has been suggested to substitute wet chemical etching—which is a well known technique, involving the use of a buffered HF solution—to solve this problem. It will be appreciated that when the volume of Schottky barrier diodes in typical arrays runs to many thousands, the problem of resistive shorts causes yield losses that are not tolerable in large scale integrated devices. Moreover, in the light of the high density for the Schottky barrier diode arrays, it becomes an ineffective remedy or solution to utilize wet chemical etching. This is because such a conventional etch acts equally in all directions (isotropic etching), imposing high etch bias tolerances, thereby resulting in irregular edges and dimensioning uncertainties. Also, when attempts are made to control this equal-directional etching by the use of fixes or the like, the device profiles are changed, leading to key device parameter differences such as $R_{db}$, $V_{bc}$ and $BV_{cbo}$.

Accordingly, a primary object of the present invention is to avoid the noted problem which occurs in the fabrication of Schottky barrier diodes when these are formed or fabricated in association with active devices such as transistors or the like.

A more specific object is to provide a technique for removing a protective layer of silicon nitride or the like which overlies an oxide layer, but doing so in such a way as to avoid formation of resistive shorts in the fabrication of the Schottky barrier diode devices.

SUMMARY OF THE INVENTION

In fulfillment of the above stated objects, a fundamental feature of the present invention resides in positioning the substrate in which the Schottky barrier diodes are to be formed in an inert atmosphere; and exposing the substrate, which includes a protective layer of insulative material and a mask situated over that protective layer, to a beam of high energy ions so as judiciously to remove material of the protective layer from the anode openings as well as the associated active device region openings in the protective layer. Accordingly, since no reactant gas is present, any pinholes in the underlying oxide layer are not subject to attack. Therefore, when impurities are diffused, as desired, through the active device region openings and through corresponding openings in the oxide layer, undesired diffusion at the Schottky regions will be blocked, such that resistive shorts will not be produced in the substrate surface regions beneath the Schottky anode openings.

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
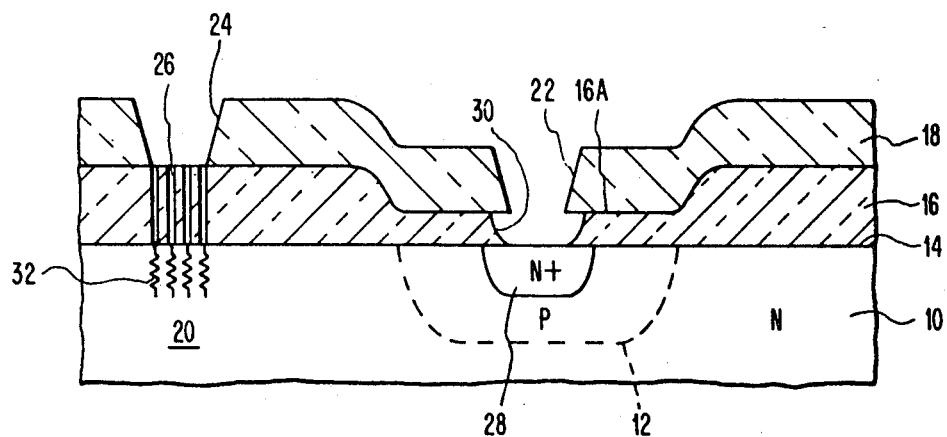
FIGS. 1 & 2 illustrate several of the steps involved in fabricating an integral semiconductor device array in accordance with both the prior art and the technique of the present invention.
Figure 2:
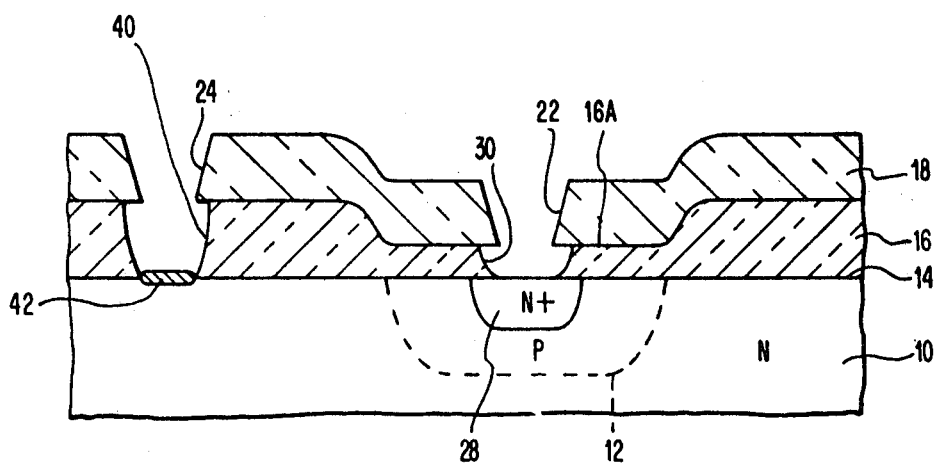

Referring now to FIGS. 1 & 2, the improved process or technique of the present invention will now be described. Pursuant to the application of well known standard photolithographic masking and etching techniques, a semiconductor substrate 10 is provided with a base region 12 formed at the top surface 14 of the substrate. In addition to an initial oxide layer 16 grown in the procedure for forming the base region, a further protective layer 18, typically of silicon nitride ($Si_3N_4$), is formed so as to overlie the oxide layer 16.

The initial oxide layer is formed to have a thickness of approximately 2000 Angstroms, and it will be appreciated that the thinner portion 16A of approximately 800 Angstroms results from reoxidation following the formation of base region 12. The overlying layer 18 of silicon nitride has a thickness of approximately 1600 Angstroms.

It will be understood that the fragmentary showing in FIG. 1 is intended simply to illustrate the principle of the present invention vis-a-vis the prior art, and that rather than the simplified structure shown, a complicated array of active device regions such as the region 12 and associated Schottky barrier diode regions 20 would be formed. The Schottky barrier diodes typically function as clamps or the like on the associated transistors or the like in the arrays that are achieved.

Following the formation of the overlying layer 18, the required openings 22 and 24 are created therein, this being accomplished by well known photoresist or photolithography techniques. In accordance with the prior art, the etching of the layer 18 of $Si_3N_4$ to define the openings 22 and 24 is effected by a technique known as RIE, that is to say, a reactive ion etching step, in which a gas such as oxygen or $CF_4$ is employed. However, as already indicated, the problem that arises in the prior art context of the formation of Schottky barrier diodes and associated active devices in suitable arrays is that when the etching to create the openings 22 and 24 takes place, pinholes which exist in the oxide layer 16 directly under the anode opening 24 for the Schottky barrier diode are attacked by the reactant gas. This results in the formation of diffusion pathways or "pipes" 26 seen in FIG. 1.

Accordingly, when the diffusion operation to create an emitter region 28 is performed, by way of the corresponding openings 30 formed in a conventional manner through the oxide layer 16, there normally results, at the same time, diffusion through the pathways 26 so as to produce low resistance "shorts" 32 within the body of semiconductor material, that is, in the region 20 of the Schottky barrier diodes.

However, in accordance with the technique of the present invention, this problem of resistive shorts is overcome by reason of the fact that ion etching in an inert atmosphere is carried out, being precisely directed in this context to eliminate the reactive etching which has conventionally occurred. Therefore, the pinholes which exist in the silicon oxide layer 16 at the anode openings 24 are not attacked. Consequently, no diffusion pathways or pipes 26 are formed in the oxide layer.

Ion etching through a pattern mask as a general technique is known as is exemplified by U.S. Pat. No. 3,860,783. However, for the purposes of the present implementation of that technique, it is recommended that the following parameters be selected:

| | |
|---|---|
| Acceleration Voltage | ~500 eV or greater |
| Argon Gas Pressure | ~5 × $10^{-5}$ torr |
| Angle of Incidence of the Ion Beam | ~90° |
| Approx. $Si_3N_4$ Etch Rate (at above conditions) | ~200 A/min. |

The above parameters have been set forth in order to enable one skilled in the art to practice the invention in some detail. However, varying angles of incidence of the ion gun and of the substrate table with respect to ion gun distances could be provided so as to give optimum etch rates of approximately 700–900 Angstroms per minute.

In the application of ion etching, or ion milling as it is sometimes called, it will be understood that a pattern mask (not shown) is developed over the protective layer 18 in FIG. 1. In other words, the standard photolithographic technique is utilized, with care being taken in selecting the thickness of the photolithographic polymer to be used. It must be borne in mind that during ion bombardment, the mask material is removed at roughly the same rate as the exposed portion of the protective layer 18 so that a polymer thickness must be chosen accordingly. Therefore, a polymer layer of at least 1600 Angstroms in the particular example given for the protective layer must be selected in order to limit the size of the openings 22 and 24.

Following the aforenoted diffusion operation which is directed to producing the emitter region 28, a suitable opening 40 (FIG. 2) is created below each of the anode openings 24 in the protective layer. That is to say, an opening through the oxide layer 16 is provided so that a platinum silicide contact 42 can be formed. The formation of such a contact, which is a rectifying contact, can be appreciated in detail by reference to U.S. Pat. No. 4,135,998 already cited.

In any event, the platinum silicide contact 42 formed at the surface of the substrate 10 will now insure proper diode performance because of the absence, due to the present invention of resistive shorts. Thus Schottky diodes made in accordance with the technique of the present invention will exhibit the required Schottky barrier effect and will have fast switching speeds as well as relatively low forward barrier or turn-on voltages.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. An improved method of forming Schottky barrier diodes, while forming associated devices having active regions, in an integral semiconductor substrate, comprising the steps of:
    (a) forming an insulative oxide layer on a surface of said substrate;
    (b) forming a further, protective layer over said oxide layer;
    (c) positioning a mask on said protective layer, said mask having openings therein corresponding (1) to anode openings for said Schottky barrier diodes and (2) to active region openings for said associated devices to be formed by diffusion in said substrate;
    (d) positioning said substrate with the layers and mask thus formed in a purely inert atmosphere;
    (e) exposing said substrate thus formed to a beam of ions so as to etch said Schottky anode openings and said associated device region openings in said protective layer;
    (f) forming the diffusion openings in said oxide layer for the creation of said active regions of the associated devices; and
    (g) diffusing impurities through said diffusion openings, whereby active regions for the associated devices are formed by the diffusion without causing shorts in the substrate region beneath said Schottky anode openings.

2. An improved method as defined in claim 1, in which said further, protective layer is constituted of Si$_3$N$_4$.

3. An improved method as defined in claim 1, in which said associated devices are transistors having first and second active regions.

4. An improved method as defined in claim 3, in which said first active region is a base region for said transistors, and said second active region is an emitter region.

5. A method as defined in claim 1, in which said mask is produced by a photolithographic process.

6. A method as defined in claim 1, in which said ion beam is incident on the surface at an angle of essentially 90°.

7. A method as defined in claim 6, in which the atmosphere is argon at a pressure of $\sim 5 \times 10^{-5}$ torr.

* * * * *

UNITED STATES PATENT AND TRADEMARK OFFICE
CERTIFICATE OF CORRECTION

PATENT NO. : 4,397,079

DATED : August 9, 1983

INVENTOR(S) : A. Nagarajan and H.G. Sarkary

It is certified that error appears in the above-identified patent and that said Letters Patent are hereby corrected as shown below:

Column 1, line 54, "invention" should read --inventors--.

Column 3, line 63, "A" should read --Å--.

Signed and Sealed this

Eighteenth Day of October 1983

[SEAL]

Attest:

GERALD J. MOSSINGHOFF

Attesting Officer     Commissioner of Patents and Trademarks